United States Patent
Oka

(10) Patent No.: US 9,786,713 B2
(45) Date of Patent: Oct. 10, 2017

(54) SOLID-STATE IMAGE PICKUP APPARATUS, METHOD OF MANUFACTURING THE SAME, AND ELECTRONIC APPARATUS

(71) Applicant: Sony Corporation, Tokyo (JP)

(72) Inventor: Osamu Oka, Kumamoto (JP)

(73) Assignee: Sony Corporation, Tokyo (JP)

( * ) Notice: Subject to any disclaimer, the term of this patent is extended or adjusted under 35 U.S.C. 154(b) by 52 days.

(21) Appl. No.: 14/501,847

(22) Filed: Sep. 30, 2014

(65) Prior Publication Data

US 2015/0098006 A1   Apr. 9, 2015

(30) Foreign Application Priority Data

Oct. 8, 2013  (JP) .................................. 2013-211187

(51) Int. Cl.
*H01L 27/146*  (2006.01)

(52) U.S. Cl.
CPC .. *H01L 27/14685* (2013.01); *H01L 27/14621* (2013.01); *H01L 27/14623* (2013.01); *H01L 27/14627* (2013.01)

(58) Field of Classification Search
CPC ......... H01L 27/14685; H01L 27/14621; H01L 27/14623; H01L 27/14627
USPC ...................................................... 257/435
See application file for complete search history.

(56) References Cited

U.S. PATENT DOCUMENTS

| 8,325,254 | B2 * | 12/2012 | Yanagita | ........... H01L 27/14623 257/435 |
| 8,981,512 | B1 * | 3/2015 | Chen | ................. H01L 27/14621 257/432 |
| 2008/0191209 | A1 * | 8/2008 | Moon | ............... H01L 27/14623 257/59 |
| 2009/0072281 | A1 * | 3/2009 | Kim | .................. H01L 27/14603 257/292 |
| 2009/0147101 | A1 * | 6/2009 | Tatani | ............... H01L 27/14621 348/224.1 |
| 2010/0110271 | A1 * | 5/2010 | Yanagita | ........... H01L 27/14623 348/340 |
| 2010/0302432 | A1 * | 12/2010 | Komuro | ............. H04N 5/23212 348/340 |
| 2011/0129955 | A1 * | 6/2011 | Gambino | .......... H01L 27/14627 438/70 |

(Continued)

FOREIGN PATENT DOCUMENTS

JP   2007-281296 A   10/2007
JP   2008071972 A  *  3/2008

(Continued)

*Primary Examiner* — Earl Taylor
(74) *Attorney, Agent, or Firm* — Sheridan Ross P.C.

(57) ABSTRACT

A solid-state image pickup apparatus includes an image pickup pixel and a focus detection pixel. The image pickup pixel includes a micro lens and a photoelectric conversion unit that receives light incident from the micro lens. The focus detection pixel includes the micro lens, the photoelectric conversion unit, and a light shielding unit that shields part of light incident on the photoelectric conversion unit. In the solid-state image pickup apparatus, the micro lens is uniformly formed in the image pickup pixel and the focus detection pixel, and the focus detection pixel further includes a high refractive index film formed under the micro lens.

7 Claims, 12 Drawing Sheets

(56) References Cited

U.S. PATENT DOCUMENTS

| | | | | |
|---|---|---|---|---|
| 2012/0075509 A1* | 3/2012 | Ito | H01L 27/14621 | 348/265 |
| 2012/0235263 A1* | 9/2012 | Ogita | H01L 27/14621 | 257/432 |
| 2012/0249846 A1* | 10/2012 | Nishio | H01L 27/14603 | 348/294 |
| 2012/0320242 A1* | 12/2012 | Ogita | H01L 27/14621 | 348/276 |
| 2013/0015545 A1* | 1/2013 | Toumiya | H01L 27/14605 | 257/432 |
| 2013/0100324 A1* | 4/2013 | Ogino | H01L 27/14621 | 348/294 |
| 2014/0104474 A1* | 4/2014 | Tange | H01L 27/14627 | 348/308 |
| 2014/0210032 A1* | 7/2014 | Maeda | H01L 27/14621 | 257/432 |
| 2014/0346628 A1* | 11/2014 | Okazaki | H01L 27/14623 | 257/432 |
| 2015/0035104 A1* | 2/2015 | Horikoshi | H01L 27/14627 | 257/432 |
| 2015/0035105 A1* | 2/2015 | Nakajiki | H01L 27/14623 | 257/432 |
| 2015/0048473 A1* | 2/2015 | Takahashi | H01L 27/1461 | 257/443 |
| 2015/0076643 A1* | 3/2015 | Kikuchi | H01L 27/14621 | 257/432 |
| 2015/0098006 A1* | 4/2015 | Oka | H01L 27/14621 | 348/340 |
| 2015/0098007 A1* | 4/2015 | Harasawa | H01L 27/14621 | 348/342 |
| 2015/0102442 A1* | 4/2015 | Ootsuka | H04N 5/23212 | 257/432 |
| 2016/0027830 A1* | 1/2016 | Hirano | H01L 27/14623 | 348/308 |

FOREIGN PATENT DOCUMENTS

| | | | | |
|---|---|---|---|---|
| JP | 2009-109965 A | | 5/2009 | |
| JP | 2013021168 A | * | 1/2013 | |
| JP | WO 2015001769 A2 | * | 1/2015 | ....... H01L 27/14621 |
| JP | WO 2015001769 A3 | * | 3/2015 | ....... H01L 27/14621 |
| JP | WO 2015045914 A1 | * | 4/2015 | ........... G02B 3/0018 |
| JP | WO 2015063965 A1 | * | 5/2015 | ....... H01L 27/14621 |

* cited by examiner

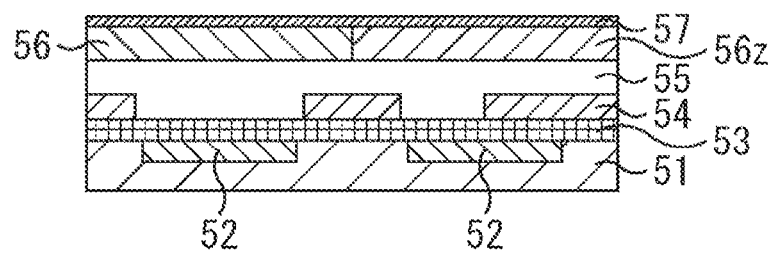
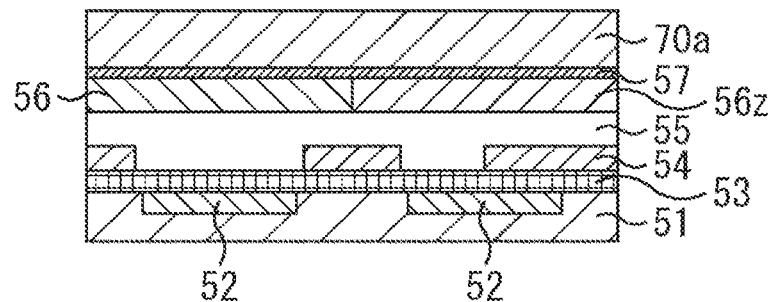
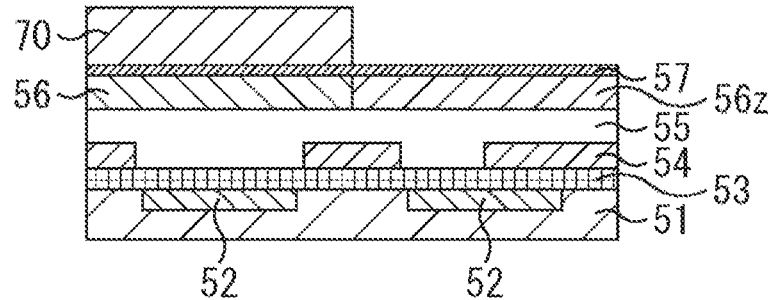
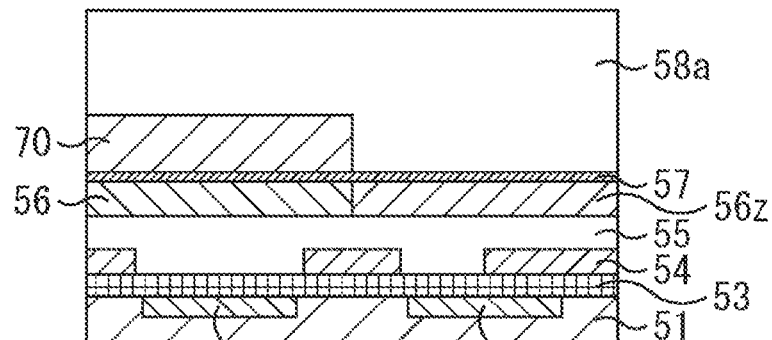
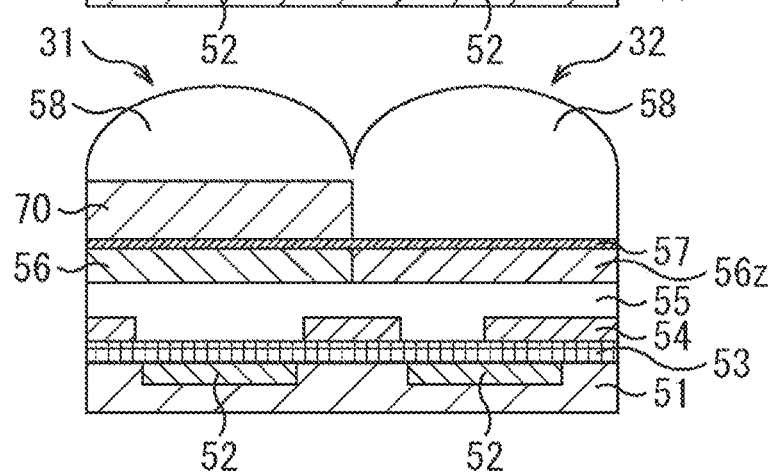

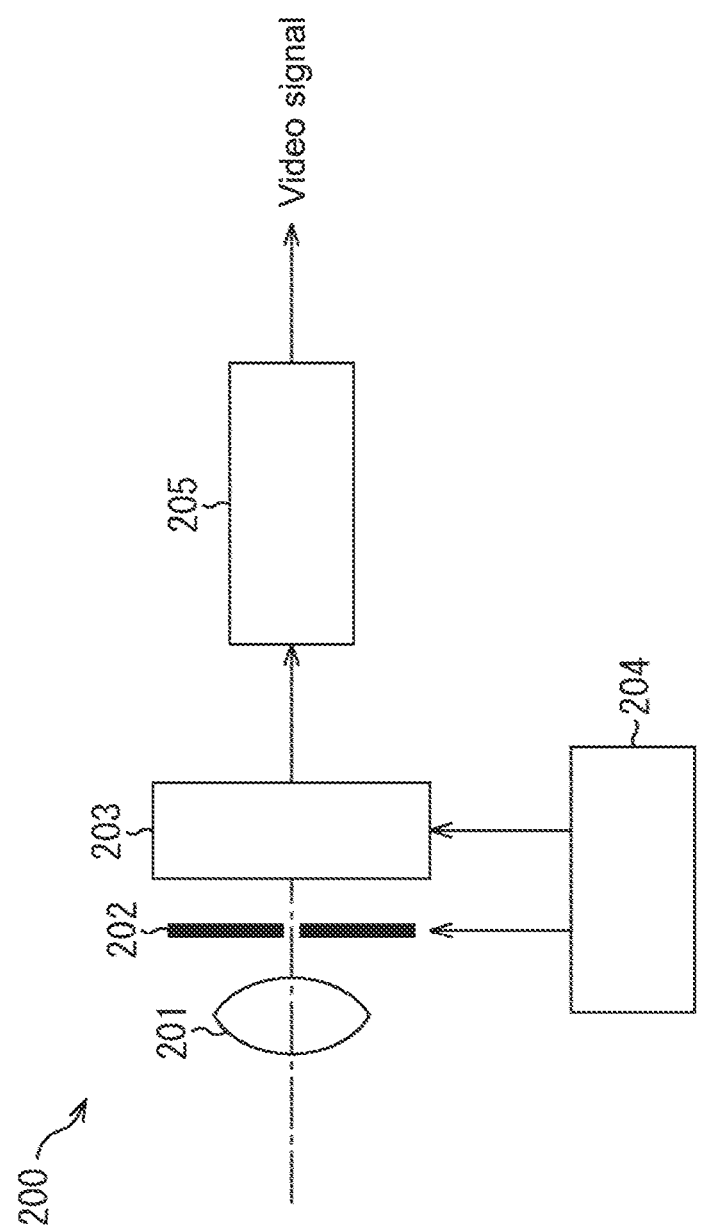

SOLID-STATE IMAGE PICKUP APPARATUS, METHOD OF MANUFACTURING THE SAME, AND ELECTRONIC APPARATUS

CROSS REFERENCE TO RELATED APPLICATIONS

This application claims the benefit of Japanese Priority Patent Application JP 2013-211187 filed Oct. 8, 2013, the entire contents of which are incorporated herein by reference.

BACKGROUND

The present technology relates to a solid-state image pickup apparatus, a method of manufacturing the same, and an electronic apparatus, and in particular, relates to a solid-state image pickup apparatus, a method of manufacturing the same, and an electronic apparatus which make it possible to optimize sensitivity of an image pickup pixel and separation performance of a focus detection pixel.

There is known a solid-state image pickup apparatus that performs a focus detection by a so-called pupil division phase difference system for detecting a focus on the basis of a shift amount of signals output by a pair of focus detection pixels. In the solid-state image pickup apparatus, a focus detection pixel is provided to a pixel array unit with an image pickup pixel.

In such a solid-state image pickup apparatus, the image pickup pixel exhibits a maximum sensitivity in the case where there is a light collection point of a micro lens on a light receiving surface of a photoelectric conversion unit on a layer lower than a light shielding film. On the other hand, the focus detection pixel exhibits a maximum separation performance in the case where there is the light collection point of the micro lens on the light shielding film. However, in related art, the sensitivity of the image pickup pixel is optimized at the expense of the separation performance of the focus detection pixel.

In view of this, in the focus detection pixel, in order to cause the light collection point of the micro lens to coincide with that of the image pickup pixel, individually producing micro lenses for the image pickup pixel and the focus detection pixel has been proposed (see, for example, Japanese Patent Application Laid-open No. 2009-109965).

In addition, the structure has been disclosed in which a step is provided on a position on the focus detection pixel where the micro lens is installed, thereby adjusting the light collection point of the micro lens (see, for example, Japanese Patent Application Laid-open No. 2007-281296).

SUMMARY

However, in the structure disclosed in Japanese Patent Application Laid-open No. 2009-109965, the micro lenses have not been easily collectively formed for the image pickup pixel and the focus detection pixel.

Further, in the structure of Japanese Patent Application Laid-open No. 2007-281296, in the focus detection pixel, the micro lens is higher than the image pickup pixel, so shading is caused in the image pickup pixel adjacent to the focus detection pixel, resulting in deterioration of image quality.

In view of the circumstances as described above, it is desirable to simplify a forming process for a micro lens and optimize the sensitivity of the image pickup pixel and the separation performance of the focus detection pixel.

According to a first embodiment of the present technology, there is provided a solid-state image pickup apparatus including an image pickup pixel and a focus detection pixel. The image pickup pixel includes a micro lens and a photoelectric conversion unit that receives light incident from the micro lens. The focus detection pixel including the micro lens, the photoelectric conversion unit, and a light shielding unit that shields part of light incident on the photoelectric conversion unit. The micro lens is uniformly formed in the image pickup pixel and the focus detection pixel, and the focus detection pixel further includes a high refractive index film formed under the micro lens.

The micro lens may have a light collection point on the photoelectric conversion unit.

According to the first embodiment of the present technology, there is provided a method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit. The method of manufacturing a solid-state image pickup apparatus includes forming a high refractive index film under the micro lens in the focus detection pixel, and uniformly forming the micro lenses in the image pickup pixel and the focus detection pixel.

According to the first embodiment of the present technology, there is provided an electronic apparatus including a solid-state image pickup apparatus including an image pickup pixel and a focus detection pixel. The image pickup pixel includes a micro lens and a photoelectric conversion unit that receives light incident from the micro lens, and the focus detection pixel includes the micro lens, the photoelectric conversion unit, and a light shielding unit that shields part of light incident on the photoelectric conversion unit. The micro lens is uniformly formed in the image pickup pixel and the focus detection pixel, and the focus detection pixel further includes a high refractive index film formed under the micro lens.

In the first embodiment of the present technology, in the focus detection pixel, the high refractive index film is formed under the micro lens, and the micro lens is uniformly formed in the image pickup pixel and the focus detection pixel.

According to a second embodiment of the present technology, there is provided a solid-state image pickup apparatus including an image pickup pixel and a focus detection pixel. The image pickup pixel includes a micro lens and a photoelectric conversion unit that receives light incident from the micro lens, and the focus detection pixel includes the micro lens, the photoelectric conversion unit, and a light shielding unit that shields part of light incident on the photoelectric conversion unit. The micro lens is uniformly formed in the image pickup pixel and the focus detection pixel, and the image pickup pixel further includes a low refractive index film formed under the micro lens.

The micro lens may have a light collection point on the light shielding unit.

The low refractive index film may be formed to have a thickness corresponding to a wavelength range of light that passes through a color filter held by the image pickup pixel.

According to the second embodiment of the present technology, there is provided a method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit. The method of manufacturing a solid-state image pickup apparatus includes forming a low refractive index film under the micro lens in the image pickup pixel, and uniformly forming the micro lens in the image pickup pixel and the focus detection pixel.

According to the second embodiment of the present technology, there is provided an electronic apparatus including a solid-state image pickup apparatus including an image pickup pixel and a focus detection pixel. The image pickup pixel includes a micro lens and a photoelectric conversion unit that receives light incident from the micro lens, and the focus detection pixel includes the micro lens, the photoelectric conversion unit, and a light shielding unit that shields part of light incident on the photoelectric conversion unit. The micro lens is uniformly formed in the image pickup pixel and the focus detection pixel. The image pickup pixel further includes a low refractive index film formed under the micro lens.

In the second embodiment of the present technology, in the image pickup pixel, the low refractive index film is formed under the micro lens, and the micro lens is uniformly formed in the image pickup pixel and the focus detection pixel.

According to a third embodiment of the present technology, there is provided a solid-state image pickup apparatus including an image pickup pixel and a focus detection pixel. The image pickup pixel includes a micro lens and a photoelectric conversion unit that receives light incident from the micro lens, and the focus detection pixel including the micro lens, the photoelectric conversion unit, and a light shielding unit that shields part of light incident on the photoelectric conversion unit. The micro lens is uniformly formed in the image pickup pixel and the focus detection pixel, and the image pickup pixel further includes a waveguide formed under the micro lens.

The micro lens may have a light collection point on the light shielding unit.

According to the third embodiment of the present technology, there is provided a method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit. The method of manufacturing a solid-state image pickup apparatus includes forming a waveguide under the micro lens in the image pickup pixel, and uniformly forming the micro lens in the image pickup pixel and the focus detection pixel.

According to the third embodiment of the present technology, there is provided an electronic apparatus including a solid-state image pickup apparatus including an image pickup pixel and a focus detection pixel. The image pickup pixel includes a micro lens and a photoelectric conversion unit that receives light incident from the micro lens, and the focus detection pixel includes the micro lens, the photoelectric conversion unit, and a light shielding unit that shields part of light incident on the photoelectric conversion unit. The micro lens is uniformly formed in the image pickup pixel and the focus detection pixel, and the image pickup pixel further includes a waveguide formed under the micro lens.

In the third embodiment of the present technology, in the image pickup pixel, the waveguide is formed under the micro lens, and the micro lens is uniformly formed in the image pickup pixel and the focus detection pixel.

According to the first to third embodiments of the present technology, it is possible to simplify the process of the formation of the micro lens and optimize the sensitivity of the image pickup pixel and the separation performance of the focus detection pixel.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 8A-8E are diagrams for explaining steps of a pixel formation;

FIG. 12 is a block diagram showing a structural example of an electronic apparatus to which an electronic apparatus is applied.

DETAILED DESCRIPTION OF EMBODIMENTS

Hereinafter, embodiments of the present disclosure will be described with reference to the drawings.

<Structural Example of Solid-State Image Pickup Apparatus>

Figure 1:
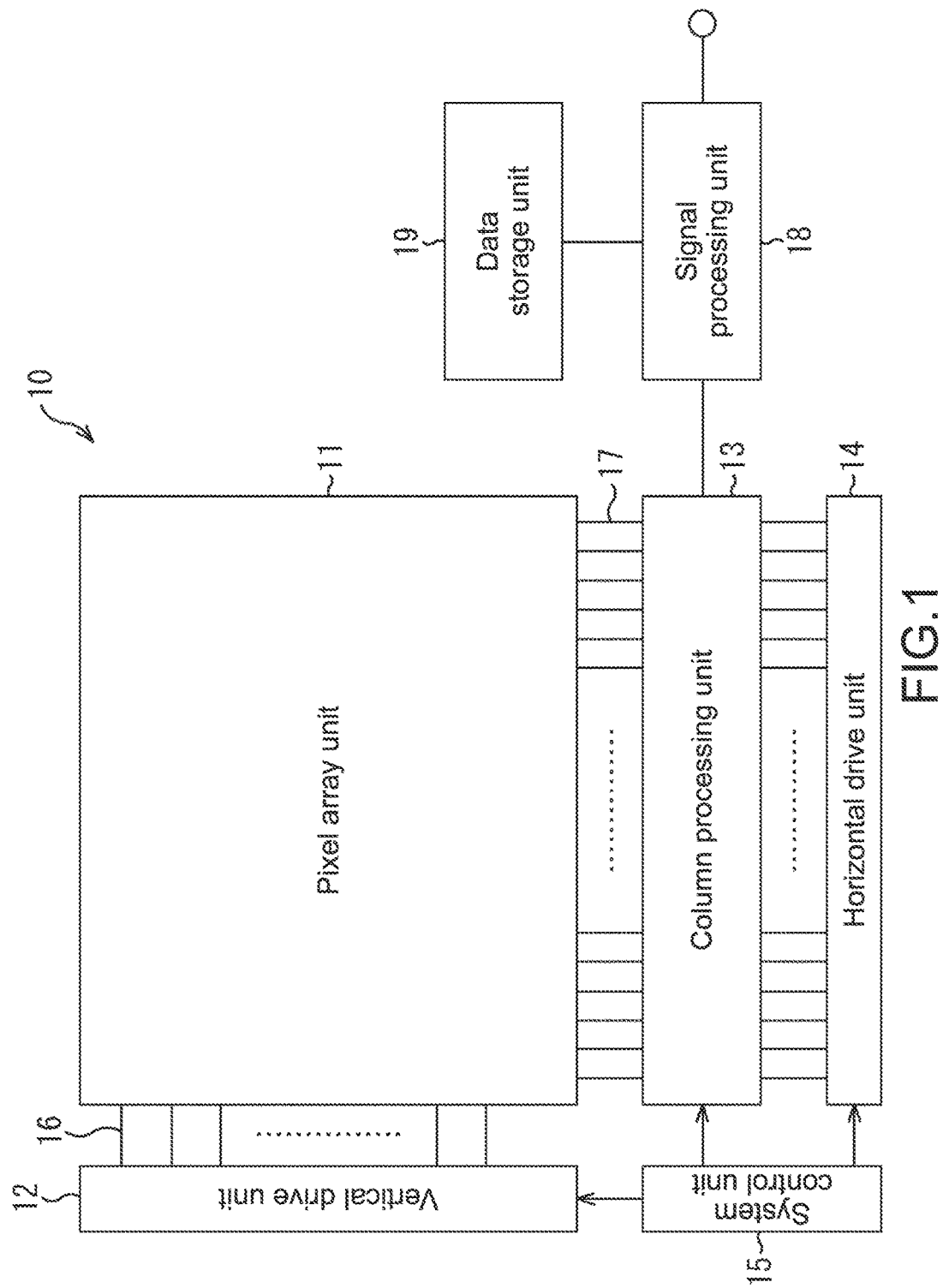
FIG. 1 is a block diagram showing a structural example of a solid-state image pickup apparatus to which the present technology is applied.

FIG. 1 is a block diagram showing an embodiment of a solid-state image pickup apparatus to which the present technology is applied. In the following, a description will be given on the structure of a back-surface irradiation type CMOS (Complementary Metal Oxide Semiconductor) image sensor, which is one of a solid-state image pickup apparatus of amplification type. It should be noted that the present technology is not applied only to a back-surface irradiation type CMOS image sensor but can be applied to a front-surface irradiation type CMOS image sensor, another solid-state image pickup apparatus of amplification type, or a solid-state image pickup apparatus of charge transfer type such as a CCD (Charge Coupled Device) image sensor.

A CMOS image sensor 10 shown in FIG. 1 includes a pixel array unit 11 formed on a semiconductor substrate (not shown) and a peripheral circuit unit integrated on the semiconductor substrate where the pixel array unit 11 is formed. The peripheral circuit unit is constituted of, for example, a vertical drive unit 12, a column processing unit 13, a horizontal drive unit 14, and a system control unit 15.

Further, the CMOS image sensor 10 is provided with a signal processing unit 18 and a data storage unit 19.

The pixel array unit 11 has such a structure that unit pixels (hereinafter, also simply referred to as pixels) each having a photoelectric conversion unit that generates and accumulates optical charges corresponding to the amount of light received are two-dimensionally arranged in a row direction and a column direction, that is, in a matrix pattern. Here, the row direction indicates a direction in which pixel rows are arranged (horizontal direction), and the column direction indicates a direction in which pixel columns are arranged (vertical direction). In the pixel array unit 11, as a plurality of pixels, pixels (image pickup pixels) that generate a signal for generating a taken image on the basis of subject light received and pixels (focus detection pixels) that generate a signal for performing focus detection are arranged.

In the pixel array unit 11, with respect to the pixel arrangement in the matrix pattern, a pixel drive line 16 is wired for each pixel row in the row direction, and a vertical signal line 17 is wired for each pixel column in the column direction. The pixel drive line 16 transmits a drive signal for performing a drive at a time when a signal is read from the pixel. In FIG. 1, the pixel drive line 16 is shown as one line but is not limited to one. One end of the pixel drive line 16 is connected to an output terminal corresponding to each row of the vertical drive unit 12.

The vertical drive unit 12 is formed of a shift register, an address decoder, or the like, and drives the pixels of the pixel array unit 11 at the same time or for each row. That is, the vertical drive unit 12 and the system control unit 15 that controls the vertical drive unit 12 constitute a drive unit that drives the pixels of the pixel array unit 11. Generally, the vertical drive unit 12 has two scanning systems of a reading scanning system and a discharging scanning system, although a specific structure thereof is not shown in the figure.

To read a signal from the unit pixel, the reading scanning system performs selective scanning for the unit pixels of the pixel array unit 11 for each row sequentially. The signal read from the unit pixel is an analog signal. With respect to the row which is subjected to the reading scanning by the reading scanning system, the discharge scanning system performs discharge scanning before the reading scanning by a time period of shutter speed.

By the discharge scanning by the discharge scanning system, unnecessary charges are discharged from the photoelectric conversion unit of the pixel unit in the row which has been subjected to the reading, thereby resetting the photoelectric conversion unit. Then, by discharging (resetting) the unnecessary charges by the discharge scanning system, an electronic shutter operation is performed. Here, the electronic shutter operation refers to an operation of discarding optical charges of the photoelectric conversion unit and newly starts exposure (starts to store optical charges).

The signal read by the reading operation by the reading scanning system corresponds to the amount of light received after the preceding reading operation or electronic shutter operation. Further, a period from the reading timing by the preceding reading operation or the discharge timing by the electronic shutter operation until the reading timing at this time by the reading operation corresponds to an exposure period of the optical charges in the unit pixel.

The signal output from each of the unit pixels of the pixel row that has been subjected to the selective scanning by the vertical drive unit 12 is input to the column processing unit 13 for each pixel column through each of the vertical signal lines 17. The column processing unit 13 performs predetermined signal processing with respect to the signal output from the pixels of the selected row through the vertical signal lines 17 for each pixel column of the pixel array unit 11 and temporarily holds the pixel signal after the signal processing.

Specifically, the column processing unit 13 performs, as the signal processing, at least noise removal process, for example, a CDS (Correlated Double Sampling) process. By the CDS process by the column processing unit 13, a fixed pattern noise unique to the pixel, such as a variation of a threshold value of an amplification transistor in the pixel, or a reset noise is removed. To the column processing unit 13, in addition to the noise removal process, for example, an AD (Analog-Digital) conversion function is given, with the result that an analog pixel signal can be converted to a digital signal and output.

The horizontal drive unit 14 is formed of a shift register, an address decoder, or the like and selects a unit circuit corresponding to the pixel column of the column processing unit 13 sequentially. By the selective scanning by the horizontal drive unit 14, a pixel signal that has been subjected to the signal processing for each unit circuit in the column processing unit 13 is output sequentially.

The system control unit 15 is formed of a timing generator or the like that generates various timing signals. On the basis of the various timing signals generated by the timing generator, the system control unit 15 performs drive control for the vertical drive unit 12, the column processing unit 13, the horizontal drive unit 14, and the like.

The signal processing unit 18 has at least a computation processing function to perform various signal processings such as a computation process with respect to the pixel signal output from the column processing unit 13. The data storage unit 19 temporarily stores necessary data for the signal processing by the signal processing unit 18.

It should be noted that the signal processing unit 18 and the data storage unit 19 may be mounted on the substrate (semiconductor substrate) on which the CMOS image sensor 10 is mounted, or may be mounted on a different substrate from the substrate on which the CMOS image sensor 10 is mounted. Further, the processes by the signal processing unit 18 and the data storage unit 19 may be performed as processes by an external signal processing unit provided on a different substrate from the substrate on which the CMOS image sensor 10 is mounted, for example, a DSP (Digital Signal Processor) circuit or software.

In addition, in the case where the CMOS image sensor 10 is a back-surface irradiation type CMOS image sensor, a laminated CMOS image sensor may be structured obtained by laminating a semiconductor substrate including the pixel array unit 11 and a semiconductor substrate including a logic circuit with each other.

<Pixel Arrangement of Pixel Array Unit>

Next, with reference to FIG. 2, the pixel arrangement of the pixel array unit 11 will be described.

Figure 2:
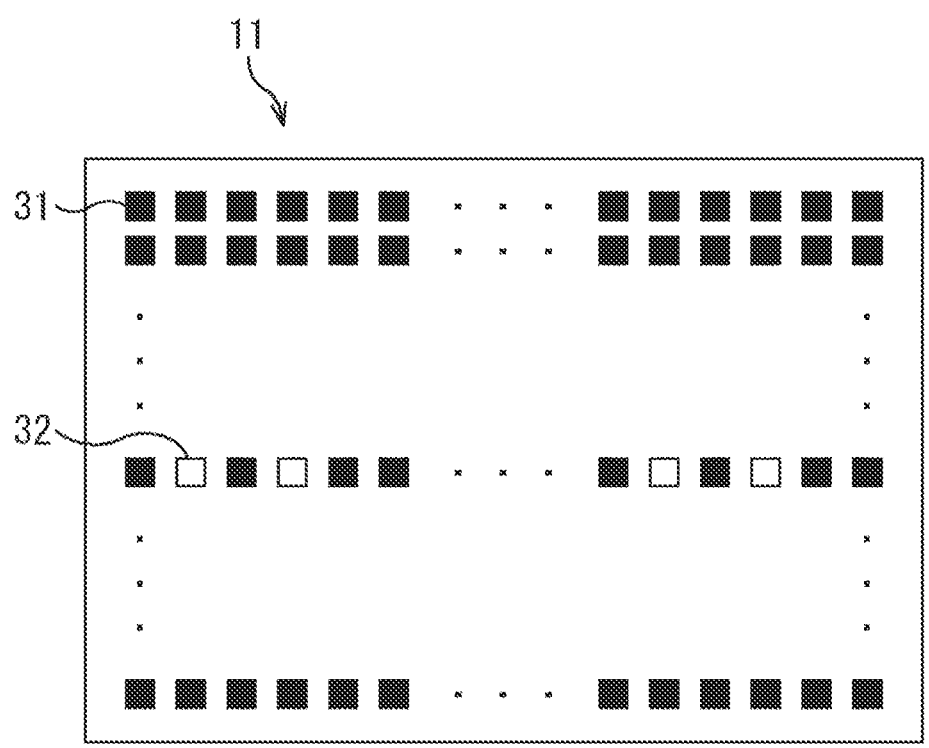
FIG. 2 is a diagram for explaining a pixel arrangement of a pixel array unit.

As shown in FIG. 2, in the pixel array unit 11, a plurality of image pickup pixels 31, which are shown as black squares, are two dimensionally arranged in a matrix pattern. The image pickup pixels 31 include R pixels, R pixels, G pixels, and B pixels, and those are arranged regularly in accordance with the Bayer arrangement.

In addition, in the pixel array unit 11, among the plurality of image pickup pixels 31 that are two-dimensionally arranged in the matrix pattern, a plurality of focus detection pixels 32, which are shown as white squares in the figure, are disposed in a scattered manner. Specifically, in a predetermined row out of the pixel rows in the pixel array unit 11, the focus detection pixels 32 are regularly disposed in a specific pattern by replacing a part of the image pickup pixels 31. It should be noted that the arrangement of the image pickup pixels 31 and focus detection pixels 32 in the pixel array unit 11 is not limited to this, but may be given as a different pattern.

Hereinafter, embodiments of the image pickup pixels 31 and the focus detection pixels 32 in the pixel array unit 11 will be described.

Structural Example of Pixel in First Embodiment

Figure 3:
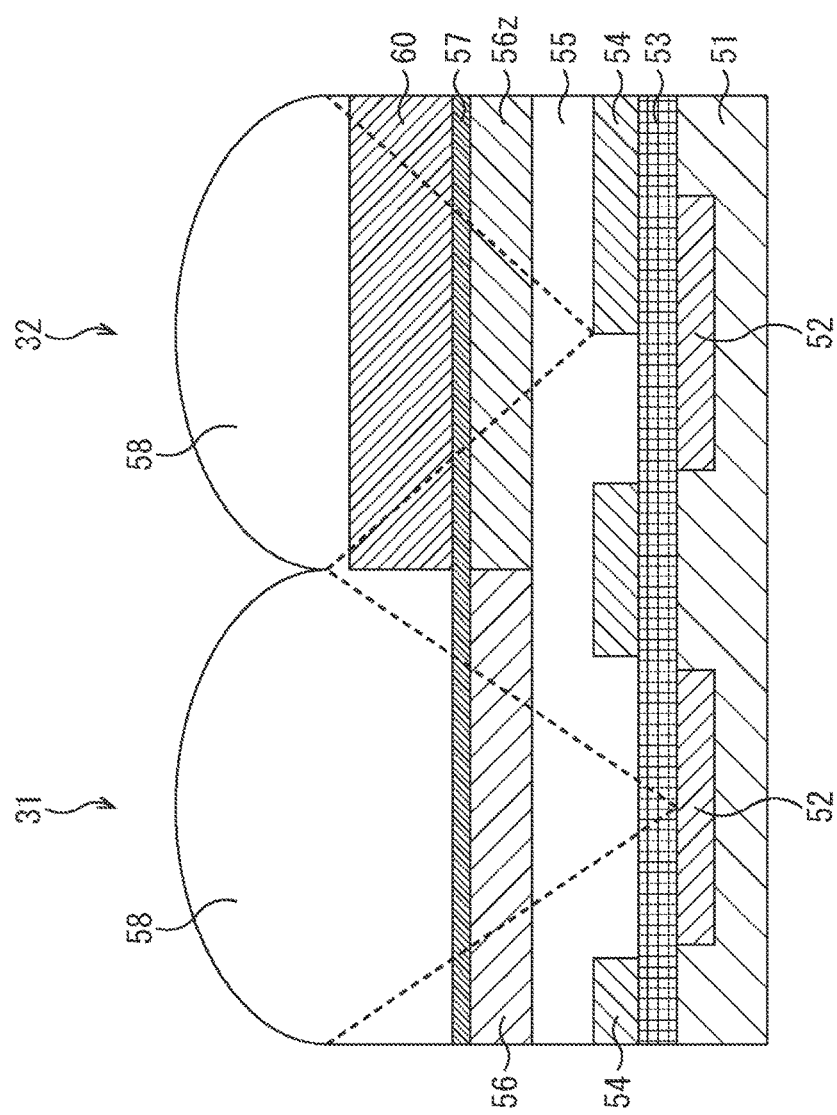
FIG. 3 is a cross-sectional view showing a structural example of a pixel according to a first embodiment of the present technology.

FIG. 3 is a cross-sectional view showing a structural example of a pixel according to a first embodiment of the present technology in the CMOS image sensor 10. FIG. 3 shows a cross-sectional view of the image pickup pixel 31 and the focus detection pixel 32 in the CMOS image sensor 10.

As shown in FIG. 3, in the image pickup pixel 31, on a semiconductor substrate 51, photoelectric conversion units 52 that receive incident light and perform photoelectric conversion is formed. On the semiconductor substrate 51, an insulating layer 53 made of SiO or the like is formed at the thickness of approximately 100 nm by an HDP (High Density Plasma) process. On the insulating layer 53, a light shielding film 54 made of W or the like is formed so as to have openings above the photoelectric conversion units 52. The thickness of the light shielding film 54 is set to approximately 200 to 250 nm. The openings thereof are generated by a photolithography process, for example.

On the insulating layer 53 including the light shielding film 54, a flattening film 55 is formed. On the flattening film 55, a color filter 56 having a spectral characteristic corresponding to each of the image pickup pixels 31 is formed of an acrylic-based base material or the like. On the color filter 56, an etching stopper film 57 made of SiO or the like is formed. On the etching stopper film 57, micro lenses 58 are formed. The micro lens 58 is formed by forming a micro lens material made of acrylic resin having a refractive index of approximately 1.6 so as to have a thickness of, for example, approximately 3000 nm, performing photolithography, and performing etch-back. It should be noted that, in the case where the CMOS image sensor 10 is the CMOS image sensor of the front surface irradiation type, on the flattening film 55, a wiring layer made of Cu or Al may be formed, and a part thereof may be formed as the light shielding film 54.

In the image pickup pixel 31, by opening the light shielding film 54, a light receiving area of the photoelectric conversion unit 52 is defined, and the light shielding film 54 is disposed so as to shield light from adjacent pixels. With this structure, in the image pickup pixel 31, the photoelectric conversion unit 52 receives subject light incident from the micro lens 58, with the result that a signal for generating a taken image is obtained.

On the other hand, in the focus detection pixel 32, as in the case of the image pickup pixel 31, the semiconductor substrate 51, the photoelectric conversion unit 52, the insulating layer 53, the light shielding film 54, the flattening film 55, the etching stopper film 57, and the micro lens 58 are formed. It should be noted that in the focus detection pixel 32, the light shielding film 54 is formed so as to have the openings each having the size approximately half of the light receiving area of the photoelectric conversion units 52. On the flattening film 55, a dark filter 56$z$ for reducing the amount of incident light to the same extent as the color filter 56 of the image pickup pixel 31. It should be noted that the dark filter 56$z$ may not be provided in the focus detection pixel 32.

Further, in the focus detection pixel 32, below the micro lens 58 and on the etching stopper film 57, a high refractive index film 60 made of SiN is formed. The refractive index of the high refractive index film 60 is set to a value larger than 1.6, in this case, set to 2.0. In addition, the thickness of the high refractive index film 60 is set to approximately 200 to 400 nm.

It should be noted that the high refractive index film 60 can be formed of another high refractive index material, instead of SiN. For example, the high refractive index film 60 may be formed of acrylic based resin. In this case, in the acrylic based resin, high refractive index materials such as $TiO_2$, $ZrO_2$, $TaO_2$, a rare-earth oxide, and $Al_2O_2$ are dispersed. Further, the high refractive index film 60 may be formed of siloxane or may be formed of a flattening film.

Further, in the image pickup pixel 31 and focus detection pixel 32, the micro lenses 58 are uniformly formed, that is, formed to have the same shape and size and have the same light collection point. Here, in the case where the pixel size is set to 1.12 μm, and the height of the micro lens is set to 400 nm, the light collection point of the micro lens 58 is set on the light reception surface of the photoelectric conversion unit 52.

As a result, in the image pickup pixel 31, the light collection point of the micro lens 58 is set on the light reception surface of the photoelectric conversion unit 52. On the other hand, in the focus detection pixel 32, the light collection point of the micro lens 58 is set on an upper surface of the light shielding film 54 by the high refractive index film 60.

In this way, in the focus detection pixel 32, the light collection point of the micro lens 58 is set on a position on an upper side from the photoelectric conversion unit 52 (micro lens 58 side) by the high refractive index film 60. It should be noted that the light collection point of the micro lens 58 can be finely set by adjusting the refractive index and the thickness of the high refractive index film 60.

With the structure of this embodiment, in the image pickup pixel 31 and focus detection pixel 32, while the micro lenses 58 are uniformly formed, the high refractive index film 60 is formed under the micro lenses 58 in the focus detection pixel 32. Therefore, in the image pickup pixel 31, the light collection point of the micro lens 58 is set on the light reception surface of the photoelectric conversion unit 52, while in the focus detection pixel 32, the light collection point of the micro lens 58 can be set on the upper surface of the light shielding film 54. That is, it is possible to simplify the forming process of the micro lens and optimize the sensitivity of the image pickup pixel and the separation performance of the focus detection pixel.

<About Flow of Formation of Pixel>

Next, with reference to FIG. 4 and FIGS. 5A-5E, a flow of the formation of the pixel will be described.

Figure 4:
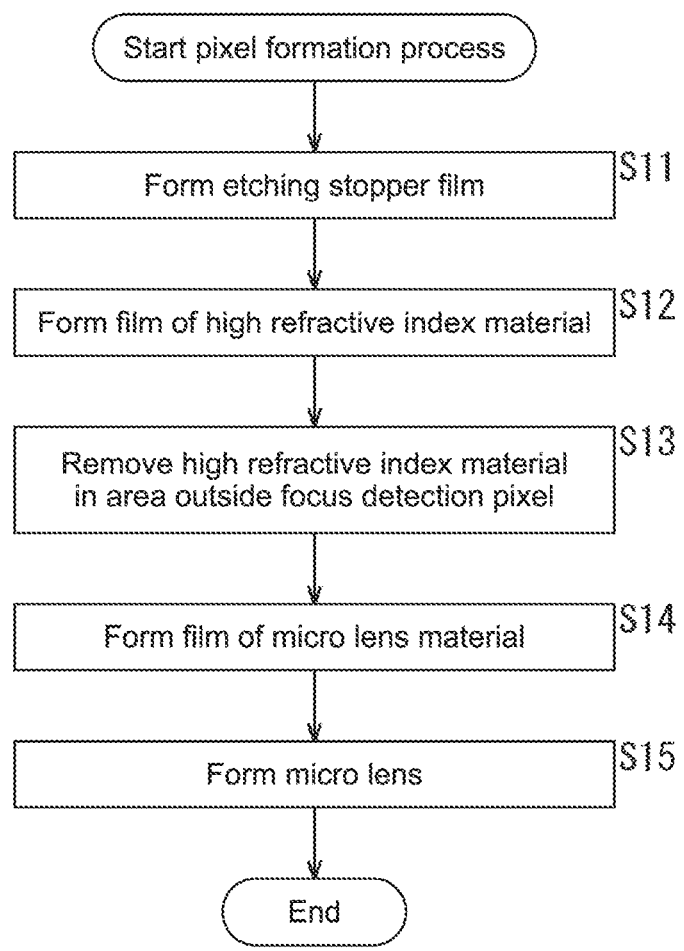
FIG. 4 is a flowchart for explaining a pixel forming process.

FIG. 4 is a flowchart for explaining a process of forming the pixel, and FIGS. 5A to 5E are cross-sectional views showing steps of the formation of the pixel.

In the following, the process after the color filter 56 and the dark filter 56z are formed will be described.

Figure 5A:
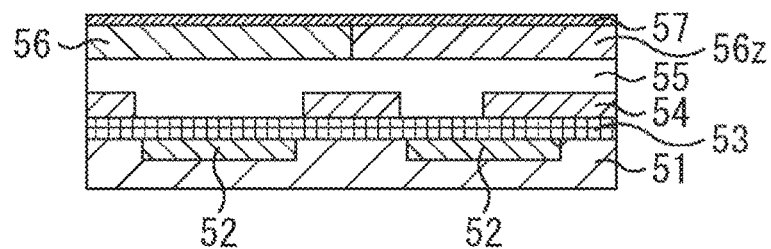
FIGS. 5A-5E are diagrams for explaining steps of a pixel formation.

In Step S11, as shown in FIG. 5A, on the color filter 56 and the dark filter 56z, the etching stopper film 57 is formed.

Figure 5B:
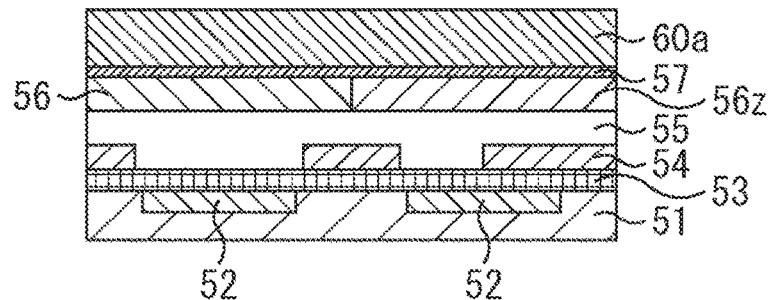

In Step S12, as shown in FIG. 5B, on the etching stopper film 57, a film of a high refractive index material 60a is formed.

Figure 5C:
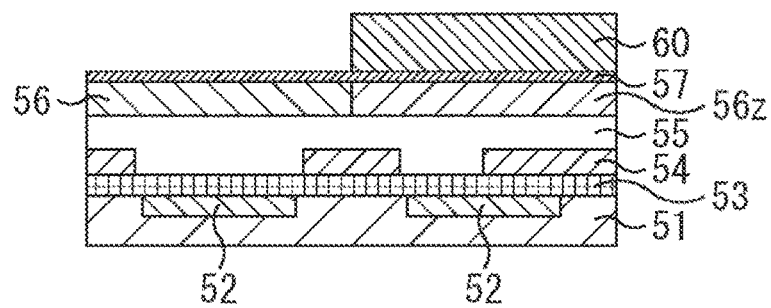
Figure 5D:
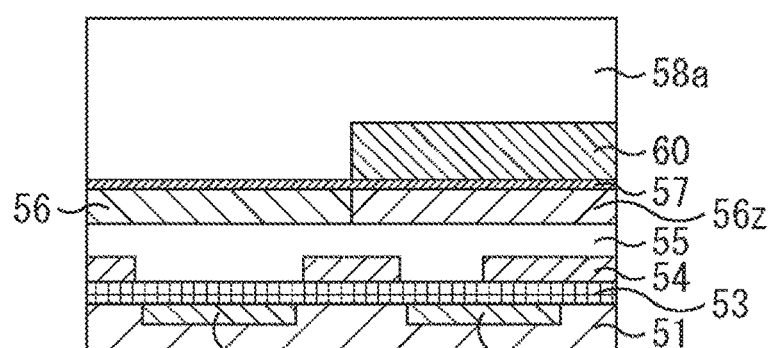

In Step S13, for an area excluding the focus detection pixel 32, dry etching is performed to remove the high refractive index material 60a. As a result, as shown in FIG. 5C, only on the area of the focus detection pixel 32, the high refractive index film 60 is formed. In Step S14, as shown in FIG. 5D, a film of a micro lens material 58a is formed by spin coating. At this time, the thickness of the micro lens material 58a is set to such a value as not to exceed 3000 nm, for example.

Figure 5E:
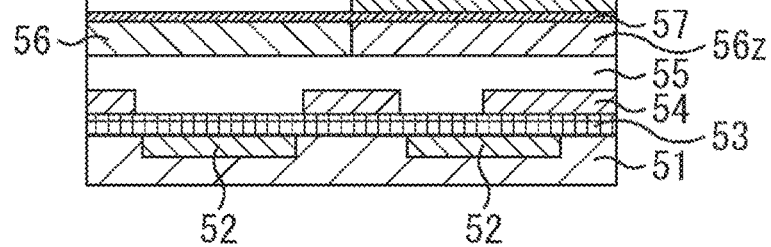

Then, in Step S15, the photolithography process is performed, and the micro lens material 58a is etched back, thereby forming the micro lens 58 as shown in FIG. 5E. It should be noted that, irrespective of the image pickup pixel 31 or the focus detection pixel 32, the micro lenses 58 are uniformly formed in such a manner that the light collection points thereof are on the light reception surfaces of the photoelectric conversion units 52.

In this way, the image pickup pixel 31 and the focus detection pixel 32 are formed.

Through the above process, in the image pickup pixel 31 and the focus detection pixel 32, the micro lenses 58 are uniformly formed, and in the focus detection pixel 32, under the micro lens 58, the high refractive index film 60 is formed. Therefore, in the image pickup pixel 31, while setting the light collection point of the micro lens 58 on the light reception surface of the photoelectric conversion unit 52, in the focus detection pixel 32, the light collection point of the micro lens 58 can be set on the upper surface of the light shielding film 54. That is, it is possible to simplify the formation process of the micro lens and optimize the sensitivity of the image pickup pixel and the separation performance of the focus detection pixel.

In addition, in the process described above, in forming the micro lenses, the photolithography process and the dry etching process are used without using a reflow process, so it is possible to make the formation process of the micro lenses precise and simple.

Further, because the micro lenses are uniformly formed, it is possible to suppress deterioration of an image due to variation of light collection characteristics.

Structural Example of Pixel According to Second Embodiment

Next, with reference to FIG. 6, a structural example of the pixel according to a second embodiment will be described.

Figure 6:
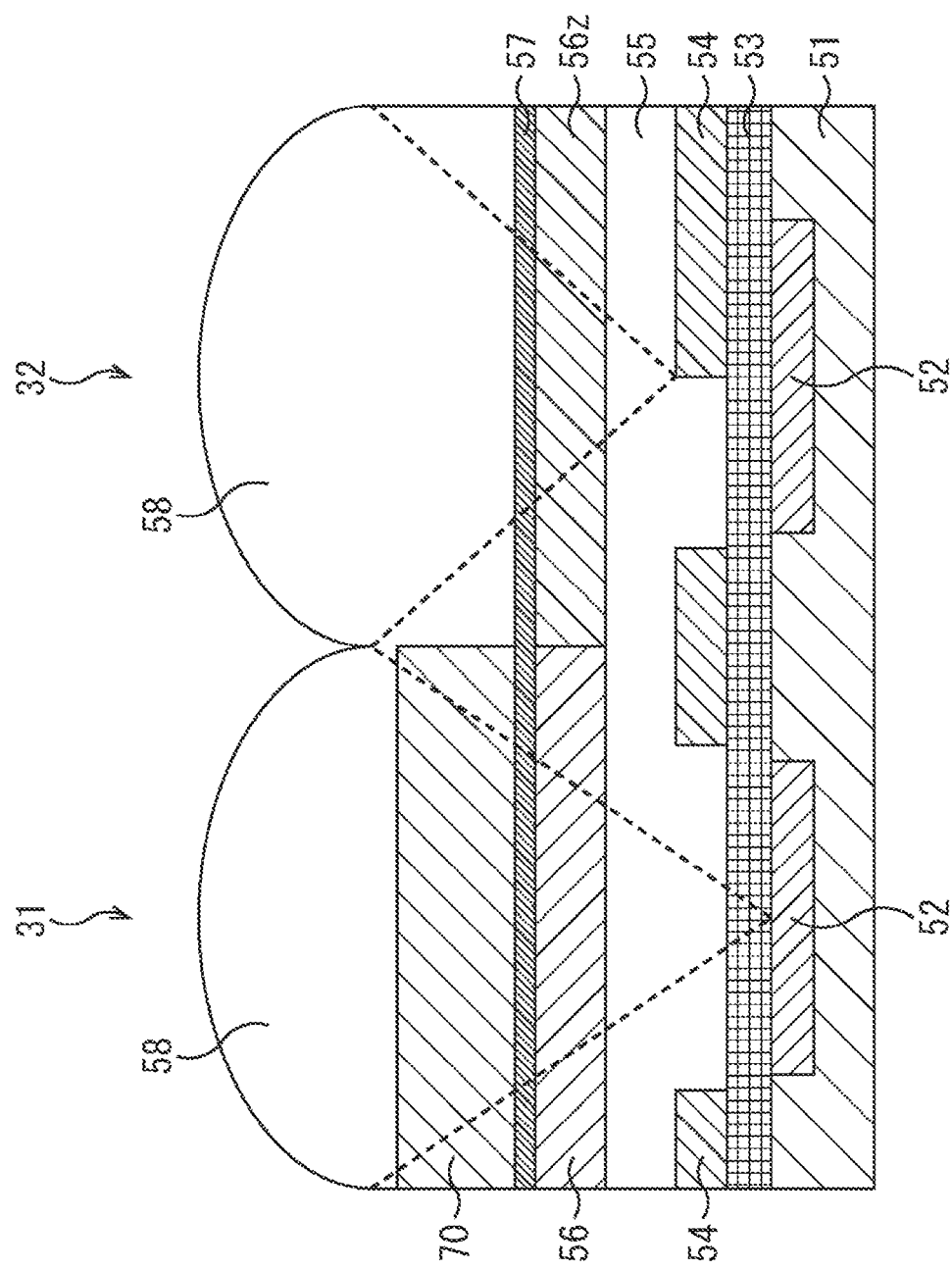
FIG. 6 is a cross-sectional view showing a structural example of a pixel according to a second embodiment of the present technology.

It should be noted that a description on a part of the image pickup pixel 31 and the focus detection pixel 32 shown in FIG. 6, which is formed in the same way as the image pickup pixel 31 and the focus detection pixel 32 shown in FIG. 3, will be omitted.

As shown in FIG. 6, in the image pickup pixel 31, under the micro lens 58 and on the etching stopper film 57, a low refractive index film 70 made of SiO is formed. The refractive index of the low refractive index film 70 is set to a value smaller than 1.6, in this case, set to 1.5. In addition, the thickness of the low refractive index film 70 is set to approximately 200 to 400 nm.

It should be noted that, in the focus detection pixel 32 shown in FIG. 6, under the micro lens 58, the high refractive index film 60 is not provided, unlike the focus detection pixel 32 shown in FIG. 3.

In addition, also in this embodiment, in the image pickup pixel 31 and the focus detection pixel 32, the micro lenses 58 are uniformly formed, that is, formed to have the same shape and size, and have the same light collection point. Here, in the case where the pixel size is set to 1.12 μm, and the height of the micro lens is set to 600 nm, the light collection point of the micro lens 58 is on the light shielding film 54.

As a result, in the focus detection pixel 32, the light collection point of the micro lens 58 is on the upper surface of the light shielding film 54. On the other hand, in the image pickup pixel 31, the light collection point of the micro lens 58 is on the light reception surface of the photoelectric conversion unit 52 by the low refractive index film 70.

In this way, in the image pickup pixel 31, the light collection point of the micro lens 58 is set to a position on a lower side from the light shielding film 54 (semiconductor substrate 51 side) by the low refractive index film 70. It should be noted that the light collection point of the micro lens 58 can be finely set by adjusting the refractive index or the thickness of the low refractive index film 70.

With the structure of this embodiment, in the image pickup pixel 31 and focus detection pixel 32, while the micro lenses 58 are uniformly formed, in the image pickup pixel 31, the low refractive index film 70 is provided under the micro lens 58. Therefore, in the focus detection pixel 32, the light collection point of the micro lens 58 is set on the upper surface of the light shielding film 54, and in the image pickup pixel 31, the light collection point of the micro lens 58 can be set on the light reception surface of the photoelectric conversion unit 52. That is, it is possible to simplify the formation process of the micro lens and optimize the sensitivity of the image pickup pixel and the separation performance of the focus detection pixel.

It should be noted that in the image pickup pixel 31, a rate of refraction of light in the low refractive index film 70 differs depending on a wavelength region of light that passes through the color filter 56.

For example, in the case where the color filter 56 is a red color filter, a wavelength of light that passes through the color filter 56 is a short wavelength in the wavelength region of visible light. The light collection point of the micro lens 58 is on the micro lens 58 side, that is, focused forward. In addition, in the case where the color filter 56 is a blue color filter, the wavelength of light that passes through the color filter 56 is a long wavelength in the wavelength range of the visible light. The light collection point of the micro lens 58 is on the semiconductor substrate 51 side, that is, focused backward.

In view of this, in the image pickup pixel 31, the thickness of the low refractive index film 70 may be set in accordance with a wavelength range of light that passes through the color filter 56.

Specifically, in the case where the color filter 56 is the red color filter, the light collection point of the micro lens 58 has a tendency to be focused forward. Accordingly, the thickness of the low refractive index film 70 is set to be thicker, approximately to 450 nm, thereby causing the light collection point to approach the semiconductor substrate 51 side. Further, in the case where the color filter 56 is the blue color filter, the light collection point of the micro lens 58 has a tendency to be focused backward. Accordingly, the thickness of the low refractive index film 70 is set to be thinner, approximately to 350 nm, thereby causing the light collection point to approach the micro lens 58 side. It should be noted that, in the case where the color filter 56 is a green color filter, the thickness of the low refractive index film 70 is set to approximately 400 nm. It should be noted that an optimal value of the thickness of the low refractive index film 70 falls within a range of the value described above ±100 nm.

As a result, it is possible to optimally set the light collection point of the micro lens 58 irrespective of the wavelength range of light that passes through the color filter 56.

<About Flow of Formation of Pixel>

Next, with reference to FIGS. 7 and 8A-8E, a flow of the formation of the pixel in this embodiment will be described.

Figure 7:
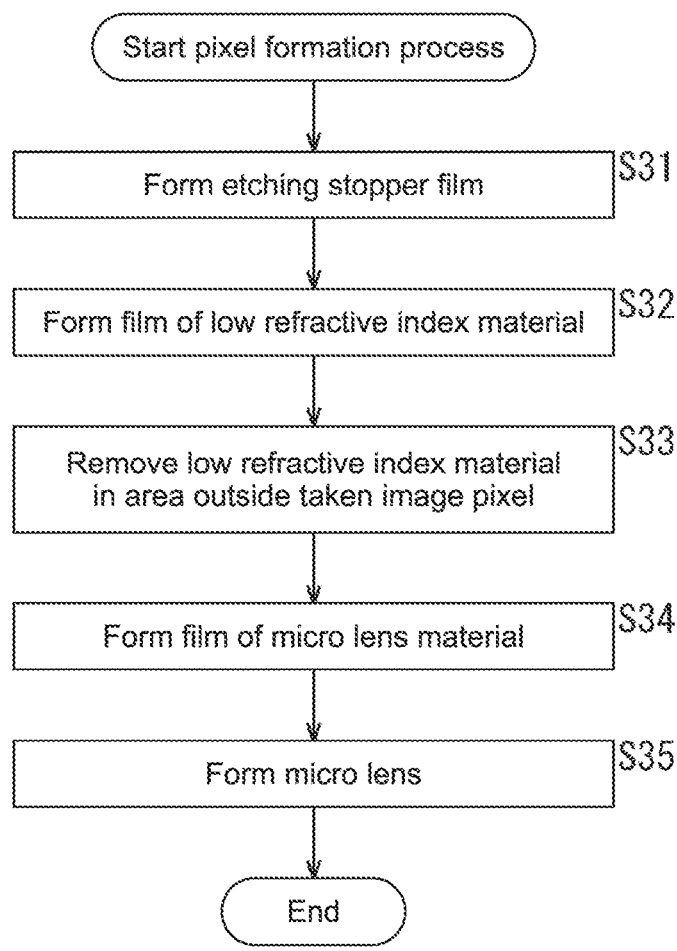
FIG. 7 is a flowchart for explaining a pixel forming process.

FIG. 7 is a flowchart for explaining a process of forming the pixel, and FIGS. 8A to 8E are cross-sectional views showing steps of the formation of the pixel.

It should be noted that in the following, the process after the color filter 56 and the dark filter 56z are formed will be described.

In Step S31, as shown in FIG. 8A, on the color filter 56 and the dark filter 56z, the etching stopper film 57 is formed.

In Step S32, as shown in FIG. 8B, on the etching stopper film 57, a film of a low refractive index material 70a is formed.

In Step S33, for an area excluding the image pickup pixel 31, dry etching is performed to remove the low refractive index material 70a. As a result, as shown in FIG. 8C, only on the area of the image pickup pixel 31, the low refractive index film 70 is formed.

In Step S34, as shown in FIG. 8D, a film of the micro lens material 58a is formed by spin coating. At this time, the thickness of the micro lens material 58a is set to such a value as not to exceed 3000 nm, for example.

Then, in Step S35, the photolithography process is performed, and the micro lens material 58a is etched back, thereby forming the micro lens 58 as shown in FIG. 8E. It should be noted that, irrespective of the image pickup pixel 31 or the focus detection pixel 32, the micro lenses 58 are uniformly formed in such a manner that the light collection points thereof are on the light reception surfaces of the light shielding film 54.

In this way, the image pickup pixel 31 and the focus detection pixel 32 are formed.

Through the above process, in the image pickup pixel 31 and the focus detection pixel 32, the micro lenses 58 are uniformly formed, and in the image pickup pixel 31, under the micro lens 58, the low refractive index film 70 is formed. Therefore, in the focus detection pixel 32, while setting the light collection point of the micro lens 58 on the upper surface of the light shielding film 54, in the image pickup pixel 31, the light collection point of the micro lens 58 can be set on the light reception surface of the photoelectric conversion unit 52. That is, it is possible to simplify the formation process of the micro lens and optimize the sensitivity of the image pickup pixel and the separation performance of the focus detection pixel.

In addition, in the process described above, in forming the micro lenses, the photolithography process and the dry etching process are used without using a reflow process, so it is possible to make the formation process of the micro lenses precise and simple.

Further, because the micro lenses are uniformly formed, it is possible to suppress deterioration of an image due to variation of light collection characteristics.

Structural Example of Pixel According to Third Embodiment

Next, with reference to FIG. 9, a structural example of the pixel according to a third embodiment will be described.

Figure 9:
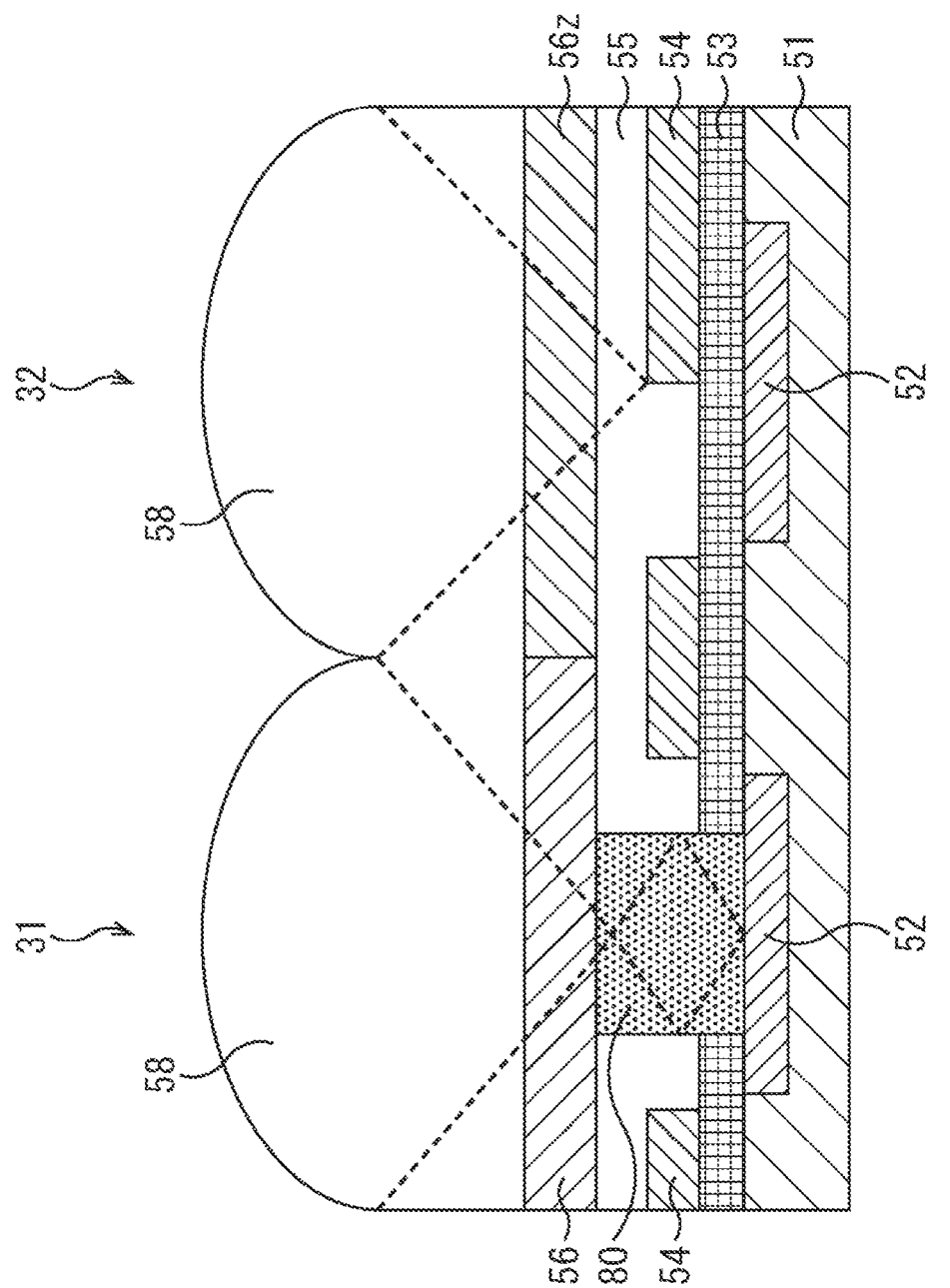
FIG. 9 is a cross-sectional view showing a structural example of a pixel according to a third embodiment of the present technology.

It should be noted that a description on a part of the image pickup pixel 31 and the focus detection pixel 32 shown in FIG. 9, which is formed in the same way as the image pickup pixel 31 and the focus detection pixel 32 shown in FIG. 6, will be omitted.

As shown in FIG. 9, in the image pickup pixel 31 and the focus detection pixel 32, on the color filter 56 and the dark filter 56z, the etching stopper film 57 is not provided. In the focus detection pixel 32, under the micro lens 58, the low refractive index film 70 is not provided.

Further, as shown in FIG. 9, in the image pickup pixel 31, under the micro lens 58, specifically, under the color filter 56 and on the photoelectric conversion unit 52, a waveguide 80 that guides light incident from the micro lens 58 to the photoelectric conversion unit 52 is formed.

The waveguide 80 is constituted of a core that transmits light and a clad that encloses light transmitted through the core. The core and clad are formed of materials each having a transmittance of 80% or more in a wavelength range of incident light. For example, the core is formed of a high refractive index material such as SiN, and the clad is formed of a low refractive index material such as SiO.

The material of the core of the waveguide 80 is not limited to SiN, and another high refractive index material can be used therefor. For example, the core of the waveguide 80 may be made of acrylic based resin. In this case, in the acrylic based resin, high refractive index materials such as $TiO_2$, $ZrO_2$, $TaO_2$, a rare-earth oxide, and $Al_2O_3$ are dispersed. Further, the core of the waveguide 80 may be formed of siloxane.

Further, in the waveguide 80, the width of the core (diameter) is set to a value obtained by dividing a wavelength of light that passes through the color filter 56 by a refractive index of the core. In addition, the width of the clad is set to 50 nm or more, desirably, approximately 100 nm. In addition, the height of the waveguide 80 is set to 300 nm or more, desirably, approximately 500 nm.

It should be noted that in the focus detection pixel 32 shown in FIG. 9, under the micro lens 58, the high refractive index film 60 is not provided, unlike the focus detection pixel 32 shown in FIG. 3.

Further, also in this embodiment, in the image pickup pixel 31 and the focus detection pixel 32, the micro lenses 58 are uniformly formed, that is, formed to have the same shape and size and have the same light collection point. Here, in the case where the pixel size is set to 1.12 μm, and the height of the micro lens is set to 600 nm, the light collection point of the micro lenses 58 is set on the upper surface of the light shielding film 54.

As a result, in the focus detection pixel 32, the light collection point of the micro lens 58 is on the upper surface of the light shielding film 54. On the other hand, in the image pickup pixel 31, the light collection point of the micro lens 58 is set in the vicinity of an opening of the waveguide 80, and light that enters the waveguide 80 from the micro lens 58 is guided to the photoelectric conversion unit 52.

In this way, in the focus detection pixel 32, the light collection point of the micro lens 58 can be set on the light reception surface of the photoelectric conversion unit 52 by the waveguide 80.

With the structure according to this embodiment, in the image pickup pixel 31 and the focus detection pixel 32, while the micro lenses 58 are uniformly formed, in the image pickup pixel 31, the waveguide 80 is provided under the micro lens 58. Therefore, in the focus detection pixel 32, the light collection point of the micro lens 58 is on the light shielding film 54, and in the image pickup pixel 31, the light collection point of the micro lens 58 can be on the light reception surface of the photoelectric conversion unit 52. That is, it is possible to simplify the process of the formation of the micro lenses and optimize the sensitivity of the image pickup pixel and the separation performance of the focus detection pixel.

<About Flow of Formation of Pixel>

Figure 10:
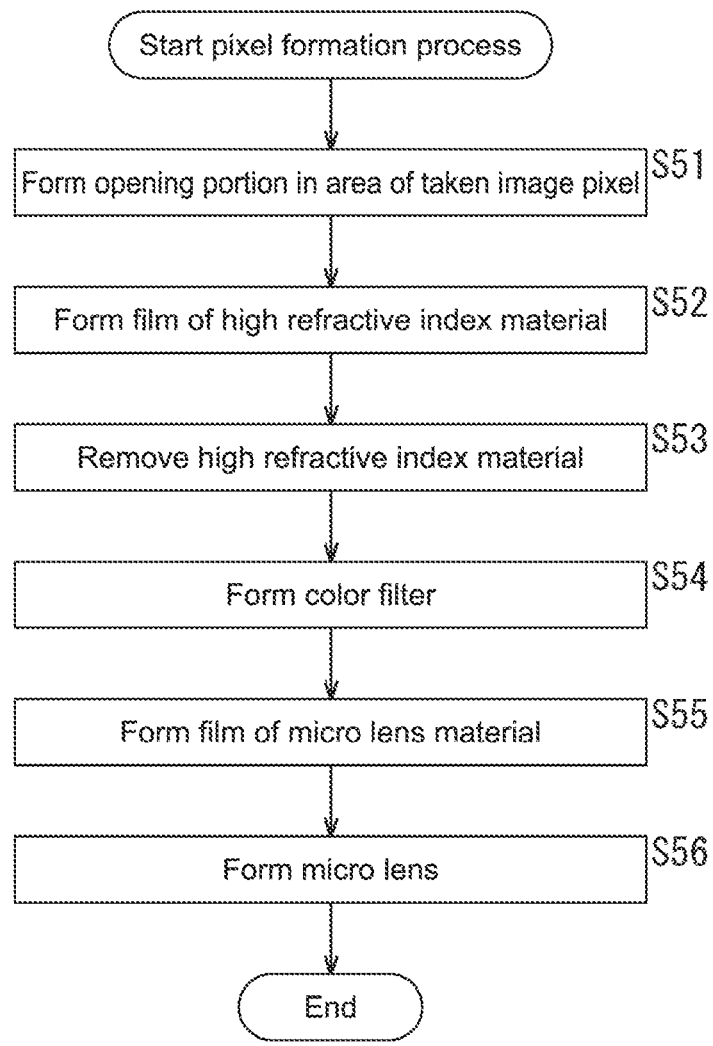
FIG. 10 is a flowchart for explaining a pixel forming process.

Next, with reference to FIGS. 10 and 11A-11F, a flow of the formation of the pixel in this embodiment will be described. FIG. 10 is a flowchart for explaining a process of forming the pixel, and FIGS. 11A to 11F are cross-sectional views showing steps of the formation of the pixel.

In the following, the process after the flattening film 55 is formed will be described. It should be noted that in this embodiment, the flattening film 55 is formed of SiO or the like from the viewpoint of workability.

Figure 11A:
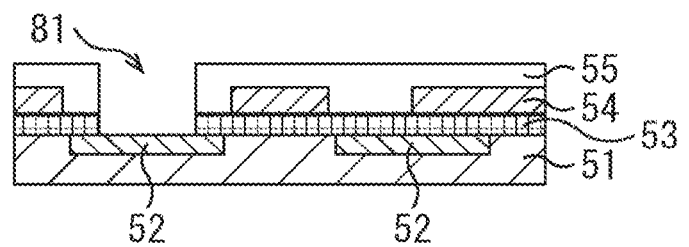
FIGS. 11A-11F are diagrams for explaining steps of a pixel formation.

In Step S51, as shown in FIG. 11A, for the area of the image pickup pixel 31, by dry etching, the flattening film 55 and the insulating layer 53 are opened, thereby forming an opening portion 81 is formed.

Figure 11B:
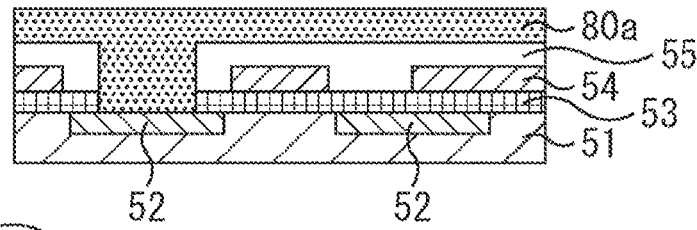

In Step S52, after a film of a low refractive index material is formed, as shown in FIG. 11B, a film of a high refractive index material 80a is formed by spin coating in such a manner that the opening portion 81 is filled.

Figure 11C:
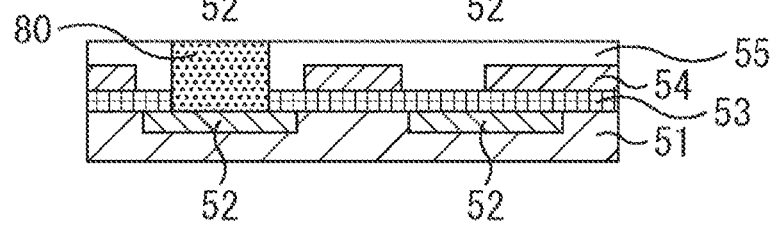

In Step S53, by entire-surface etch back or CMP (Chemical Mechanical Polishing), the high refractive index material 80a is removed. As a result, as shown in FIG. 11C, in the area of the image pickup pixel 31, the waveguide 80 is formed.

Figure 11D:
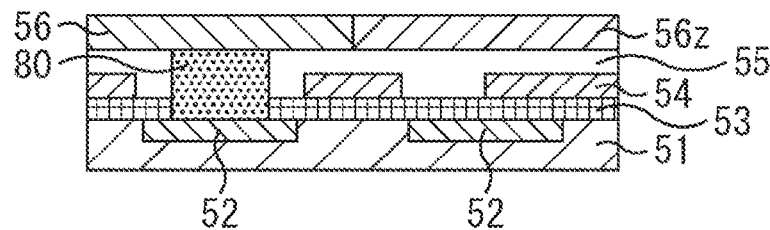

In Step S54, as shown in FIG. 11D, in the area of the image pickup pixel 31, the color filter 56 is formed, and in the area of the focus detection pixel 32, the dark filter 56z is formed.

Figure 11E:
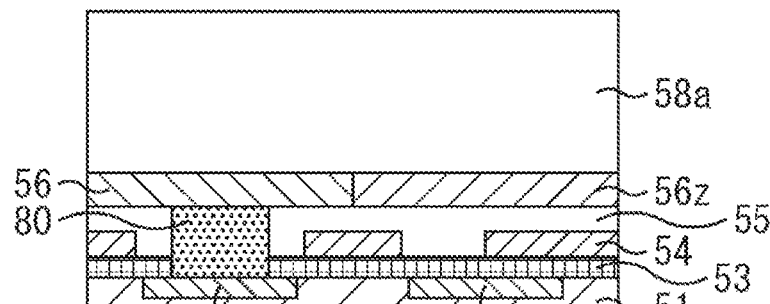

In Step S55, as shown in FIG. 11E, a film of the micro lens material 58a is formed by spin coating. At this time, the thickness of the micro lens material 58a is set to such a value as not to exceed 3300 nm.

Figure 11F:
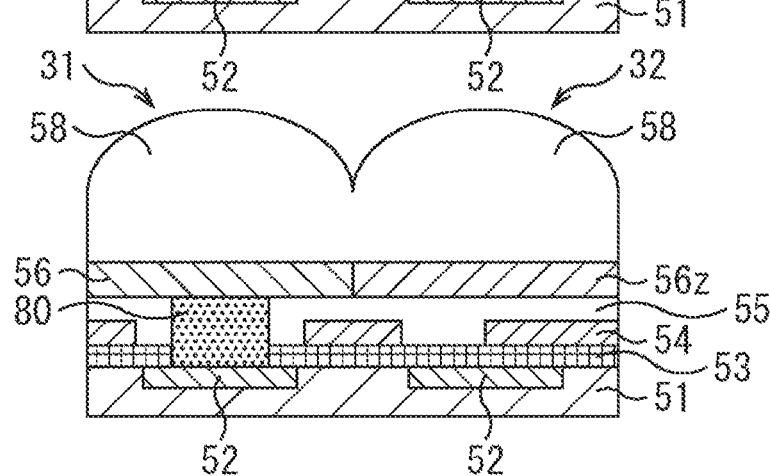

Then, in Step S56, through the photolithography process, the micro lens material 58a is etched back, the micro lenses 58 are formed as shown in FIG. 11F. It should be noted that, irrespective of the image pickup pixel 31 or the focus detection pixel 32, the micro lenses 58 are uniformly formed in such a manner that the light collection points are on the upper surface of the light shielding film 54.

In this way, the image pickup pixel 31 and the focus detection pixel 32 are formed.

Through the above process, in the image pickup pixel 31 and the focus detection pixel 32, while the micro lenses 58 are uniformly formed, in the image pickup pixel 31, the waveguide 80 is formed under the micro lens 58. Therefore, in the focus detection pixel 32, the light collection point of the micro lens 58 is set on the upper surface of the light shielding film 54, and in the image pickup pixel 31, the light collection point of the micro lens 58 can be set on the light reception surface of the photoelectric conversion unit 52. That is, it is possible to simplify the process of the formation of the micro lenses and optimize the sensitivity of the image pickup pixel and the separation performance of the focus detection pixel.

In addition, in the process described above, in forming the micro lenses, the photolithography process and the dry etching process are used without using a reflow process, so it is possible to make the formation process of the micro lenses precise and simple.

Further, because the micro lenses are uniformly formed, it is possible to suppress deterioration of an image due to variation of light collection characteristics.

Furthermore, in the process described above, the refractive indexes of the high refractive index film and the low refractive index film do not have to be adjusted, and the pixel formation process is the same process as the image pickup pixel and the focus detection pixel except providing the waveguide. Thus, it is possible to simplify the entire process of the pixel formation.

<Structural Example of Electronic Apparatus>

Next, with reference to FIG. 12, a description will be given on a structural example of an electronic apparatus to which the present technology is applied.

An electronic apparatus 200 shown in FIG. 12 is provided with an optical lens 201, a shutter apparatus 202, a solid-state image pickup apparatus 203, a drive circuit 204, and a signal processing circuit 205. FIG. 12 shows, as the solid-state image pickup apparatus 203, the structure in the case where the CMOS image sensor 10 having the pixel according to the embodiments described above is provided to an electronic apparatus (digital still camera).

The optical lens 201 forms image light (incident light) from a subject on a pickup surface of the solid-state image pickup apparatus 203. With this structure, in the solid-state image pickup apparatus 203, signal charges are accumulated for a certain time period. The shutter apparatus 202 controls a light irradiation time period and a light shielding time period with respect to the solid-state image pickup apparatus 203.

The drive circuit 204 supplies a drive signal for controlling a signal transfer operation of the solid-state image pickup apparatus 203 and a shutter operation of the shutter apparatus 202. By the drive signal (timing signal) supplied from the drive circuit 204, the solid-state image pickup apparatus 203 performs the signal transfer. The signal processing circuit 205 performs various signal processings with respect to the signal output from the solid-state image pickup apparatus 203. A video signal which has been subjected to the signal processing is stored in a storage medium such as a memory or output to a monitor.

In addition, the electronic apparatus 200 is provided with a lens drive unit (not shown) that drives the optical lens 201 in an optical axis direction thereof. The lens drive unit and the optical lens 201 constitute a focus mechanism that adjusts a focal point. Further, in the electronic apparatus 200, a system controller (not shown) performs various control operations such as control for the focus mechanism and control for the components described above.

Relating to the focus mechanism, on the basis of a focus detection signal output from the focus detection pixel in the solid-state image pickup apparatus according to the present technology, a computation process for calculating a shift direction and a shift amount of the focal point in the signal processing circuit 205 is performed, for example. As a result of the computation, the system controller causes the lens drive unit to move the optical lens 201 in the optical axis direction, thereby performing focus control to achieve a focused state.

In the electronic apparatus 200 according to the embodiment of the present technology, in the solid-state image pickup apparatus 203, it is possible to optimize the sensitivity of the image pickup pixel and the separation performance of the focus detection pixel, with the result that the quality of an image is improved.

It should be noted that the present technology is not limited to the embodiments described above and can be variously changed without departing from the gist of the present technology.

It should be noted that the present disclosure can take the following configurations.

(1) A solid-state image pickup apparatus, including:
an image pickup pixel including a micro lens and a photoelectric conversion unit that receives light incident from the micro lens; and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the focus detection pixel further includes a high refractive index film formed under the micro lens.

(2) The solid-state image pickup apparatus according to Item (1), in which
the micro lens has a light collection point on the photoelectric conversion unit.

(3) The solid-state image pickup apparatus according to Item (2), in which
the high refractive index film is formed of one of SiN, acrylic based resin, siloxane, and a flattening film.

(4) A method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit, the method of manufacturing a solid-state image pickup apparatus including:
forming a high refractive index film under the micro lens in the focus detection pixel; and
uniformly forming the micro lens in the image pickup pixel and the focus detection pixel.

(5) An electronic apparatus, including
a solid-state image pickup apparatus including
an image pickup pixel including a micro lens and a photoelectric conversion unit that receives light incident from the micro lens, and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the focus detection pixel further includes a high refractive index film formed under the micro lens.

(6) A solid-state image pickup apparatus, including:
an image pickup pixel including a micro lens and a photoelectric conversion unit that receives light incident from the micro lens; and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the image pickup pixel further includes a low refractive index film formed under the micro lens.

(7) The solid-state image pickup apparatus according to Item (6), in which
the micro lens has a light collection point on the light shielding unit.

(8) The solid-state image pickup apparatus according to Item (6) or (7), in which the low refractive index film is formed of SiO.

(9) The solid-state image pickup apparatus according to any one of Items (6) to (8), in which
the low refractive index film is formed to have a thickness corresponding to a wavelength range of light that passes through a color filter held by the image pickup pixel.

(10) A method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit, the method of manufacturing a solid-state image pickup apparatus including:
forming a low refractive index film under the micro lens in the image pickup pixel; and
uniformly forming the micro lens in the image pickup pixel and the focus detection pixel.

(11) An electronic apparatus, including
a solid-state image pickup apparatus including
an image pickup pixel including a micro lens and a photoelectric conversion unit that receives light incident from the micro lens, and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the image pickup pixel further includes a low refractive index film formed under the micro lens.

(12) A solid-state image pickup apparatus, including:
an image pickup pixel including a micro lens and a photoelectric conversion unit that receives light incident from the micro lens; and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the image pickup pixel further includes a waveguide formed under the micro lens.

(13) The solid-state image pickup apparatus according to Item (12), in which
the micro lens has a light collection point on the light shielding unit.

(14) The solid-state image pickup apparatus according to Item (12) or (13), in which
the waveguide guides light incident from the micro lens to the photoelectric conversion unit in the image pickup pixel.

(15) The solid-state image pickup apparatus according to Item (14), in which
the wave guide is constituted of a core that transmits light and a clad that encloses light transmitted through the core,
the core is formed of a high refractive index material, and
the clad is formed of a low refractive index material.

(16) The solid-state image pickup apparatus according to Item (15), in which the core is formed of one of SiN, acrylic based resin, and siloxane.

(17) The solid-state image pickup apparatus according to Item (15), in which
the clad is formed of SiO.

(18) A method of manufacturing a solid-state image pickup apparatus including an image pickup pixel and a focus detection pixel, the image pickup pixel including a micro lens and a photoelectric conversion unit that receives light incident from the micro lens, the focus detection pixel including the micro lens, the photoelectric conversion unit, and a light shielding unit that shields part of light incident on the photoelectric conversion unit, the method of manufacturing a solid-state image pickup apparatus including:
forming a waveguide under the micro lens in the image pickup pixel; and
uniformly forming the micro lens in the image pickup pixel and the focus detection pixel.

(19) An electronic apparatus, including
a solid-state image pickup apparatus including
an image pickup pixel including a micro lens and a photoelectric conversion unit that receives light incident from the micro lens, and
a focus detection pixel including the micro lens, the photoelectric conversion unit, and a light shielding unit that shields part of light incident on the photoelectric conversion unit, in which
the micro lens is uniformly formed in the image pickup pixel and the focus detection pixel, and
the image pickup pixel further includes a waveguide formed under the micro lens.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus, comprising:
an image pickup pixel, including:
a micro lens; and
a photoelectric conversion unit that receives light incident from the microlens; and
a focus detection pixel, including:
a micro lens;
a photoelectric conversion unit; and
a light shielding unit that shields part of light incident on the photoelectric conversion unit of the focus detection pixel, wherein
the micro lens of the image pickup pixel and the micro lens of the focus detection pixel are uniformly formed of a same shape and a same material, and
the focus detection pixel further includes a high refractive index film formed under the micro lens of the focus detection pixel.

2. The solid-state image pickup apparatus according to claim 1, wherein
the micro lens of the image pickup pixel has a light collection point on the photoelectric conversion unit of the image pickup pixel, and wherein
the micro lens of the focus detection pixel has a light collection point on a surface of the light shielding film.

3. The solid-state image pickup apparatus according to claim 2, wherein
the high refractive index film is formed of one of SiN, acrylic based resin, siloxane, and a flattening film.

4. A method of manufacturing a solid-state image pickup apparatus including an image pickup pixel and a focus detection pixel, the image pickup pixel including a micro lens and a photoelectric conversion unit that receives light incident from the micro lens, the focus detection pixel including a micro lens, a photoelectric conversion unit, and a light shielding unit that shields part of light incident on the photoelectric conversion unit of the focus detection pixel, the method of manufacturing a solid-state image pickup apparatus comprising:
forming a high refractive index film under the micro lens in the focus detection pixel, wherein
the refractive index of the high refractive index film is larger than 1.6; and
uniformly forming the micro lens in the image pickup pixel and the focus detection pixel of a same shape and same material.

5. An electronic apparatus, comprising
a solid-state image pickup apparatus including
an image pickup pixel including a micro lens and a photoelectric conversion unit that receives light incident from the micro lens, and
a focus detection pixel including a micro lens, a photoelectric conversion unit, and a light shielding unit that shields part of light incident on the photoelectric conversion unit, wherein
the micro lens of the image pickup pixel and the micro lens of the focus detection pixel are uniformly formed of a same shape and a same material, and
the focus detection pixel further includes a high refractive index film formed under the micro lens of the focus detection pixel.

6. The solid-state image pickup apparatus according to claim 1, wherein the high refractive index film is not present within the image pickup pixel.

7. The solid-state image pickup apparatus according to claim 1, wherein light incident on the focus detection pixel passes through the high refractive index film, and light incident on the image pickup pixel does not pass through the high refractive index film.

* * * * *